(12) United States Patent
Beratan et al.

(10) Patent No.: US 6,280,662 B1
(45) Date of Patent: Aug. 28, 2001

(54) METHODS OF FABRICATION OF CERAMIC WAFERS

(75) Inventors: Howard R. Beratan, Richardson; Tony A. Owens, Mesquite; Ida M. Gist, Dallas, all of TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 08/474,566

(22) Filed: Jun. 7, 1995

Related U.S. Application Data

(63) Continuation of application No. 08/278,738, filed on Jul. 22, 1994, now abandoned.

(51) Int. Cl.[7] ................................................ B29C 67/24
(52) U.S. Cl. .............................. 264/12; 71/102; 71/104; 71/313
(58) Field of Search ........................... 264/63, 101, 102, 264/313, 571, 572, 570, DIG. 50, DIG. 78, 12, 614, 71, 104; 425/420, 78, 405.2; 250/338.3

(56) References Cited

U.S. PATENT DOCUMENTS

| | | | |
|---|---|---|---|
| 2,251,454 | * 8/1941 | Jeffery | 264/56 |
| 2,886,849 | * 5/1959 | Brierley | 425/420 |
| 3,184,528 | 5/1965 | Norwalk | 425/89 |
| 3,499,066 | 3/1970 | Murray | 264/60 |
| 3,551,946 | * 1/1971 | Backer et al. | 264/313 |
| 3,566,450 | 3/1971 | Roberts | 425/89 |
| 3,593,380 | 7/1971 | Voronov | 425/405.2 |
| 3,608,026 | * 9/1971 | Isaksson | 264/DIG. 50 |
| 4,009,977 | * 3/1977 | Chao | 425/405.2 |
| 4,080,532 | 3/1978 | Hopper | 250/332 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,330,251 | 5/1982 | Lebas et al. | 425/405.2 |
| 4,409,174 | * 10/1983 | Toy et al. | 425/405.2 |
| 4,496,299 | 1/1985 | Pettersson | 425/405.2 |
| 4,847,021 | 7/1989 | Montgomery et al. | 425/405.2 |
| 4,927,600 | 5/1990 | Miyashita et al. | 419/49 |
| 4,934,919 | 6/1990 | Matsushita et al. | 425/405.2 |
| 4,940,897 | * 7/1990 | Forster et al. | 250/338.3 |
| 4,983,839 | * 1/1991 | Deb | 250/338.3 |
| 5,047,644 | 9/1991 | Meissner et al. | 250/332 |
| 5,238,530 | 8/1993 | Douglas et al. | 156/635 |
| 5,238,627 | * 8/1993 | Matsuhisa et al. | 264/63 |
| 5,264,168 | * 11/1993 | Tonelli | 264/63 |
| 5,264,326 | 11/1993 | Meissner et al. | 430/313 |
| 5,366,684 | 11/1994 | Corneau, Jr. | 425/389 |

FOREIGN PATENT DOCUMENTS

| | | | |
|---|---|---|---|
| 61-202799 | 9/1986 | (JP) | 425/405.1 |
| 62-35802 | 2/1987 | (JP) | 425/405.1 |

OTHER PUBLICATIONS

R.A. Wood, et al., "HIDAD–A Monolithic, Silicon, Uncooled Infrared Imaging Focal Plane Array," 16.5/Wood/HIDAD, pp. 579–581.

"Treatise on Materials, Science and Technology", vol. 9, Ceramic Fabrication Processes, Edited by Franklin F.Y. Wang, pp. 135–151; 199–215; and 331–337.

* cited by examiner

Primary Examiner—Jan H. Silbaugh
(74) Attorney, Agent, or Firm—Baker Botts L.L.P.

(57) ABSTRACT

Ceramic powder (50) may be disposed within a flexible mold (30 and 130) to form a dense ceramic wafer (60) by hydrostatic pressing. The ceramic powder (50) may include various types of pyroelectric material or bolometric material. One or more substrates (20 and 24) may be disposed within the flexible mold (30 and 130) to form the desired dense ceramic wafer (60). The flexible mold (30 and 130) may be placed in one or more vacuum sealed bags (38) prior to hydrostatic pressing. Also, a vibration table (70) may be used to minimize any void spaces in the ceramic powder (50) prior to hydrostatic pressing.

13 Claims, 2 Drawing Sheets

METHODS OF FABRICATION OF CERAMIC WAFERS

RELATED APPLICATIONS

This application is a continuation of application Ser. No. 08/278,738 filed Jul. 22, 1994, now abandoned (Attorney's Docket TI-18821), and is related to copending application Ser. No. 08/182,865 filed Jan. 13, 1994, entitled Infrared Detector and Method (Attorney's Docket TI-18788), copending application Ser. No. 08/182,268 filed Jan. 13, 1995, entitled Infrared Detector and Method (Attorney's Docket TI-17233); and copending application Ser. No. 08/049,017 filed Apr. 16, 1993 entitled Process for Forming Ceramic Pixel Array and Pixel Array Formed Thereby (Attorney's Docket TI-18340) all applications of the same assignee.

TECHNICAL FIELD OF THE INVENTION

This invention relates to forming ceramic wafers, and more particularly to forming dense ceramic wafers from pyroelectric and bolometric material for use in fabricating hybrid thermal detectors.

BACKGROUND OF THE INVENTION

One common application for thermal sensors is a thermal (infrared) imaging device such as night vision equipment. One such class of thermal imaging devices includes a focal plane array of infrared detector elements or thermal sensors having pyroelectric material. The focal plane array and its associated thermal sensors are often coupled to an integrated circuit substrate with a corresponding array of contact pads and a thermal isolation structure disposed between the focal plane array and the integrated circuit substrate. The thermal sensors define the respective picture elements or pixels of the resulting thermal image.

One type of thermal sensor includes a thermal sensitive element formed from pyroelectric material which exhibits a state of electrical polarization and/or change in dielectric constant dependent upon temperature changes of the pyroelectric material in response to incident infrared radiation. An infrared absorber and common electrode assembly are often disposed on one side of the thermal sensitive elements. A sensor signal electrode is generally disposed on the opposite side of each thermal sensitive element. The infrared absorber and common electrode assembly typically extends across the surface of the focal plane array and is attached to the thermal sensitive elements. Each thermal sensitive element generally has its own separate sensor signal electrode. Each infrared detector element or thermal sensor may be defined in part by the infrared absorber and common electrode assembly and the respective sensor signal electrode. The common electrode and the sensor signal electrode constitute capacitive plates. The pyroelectric material constitutes a dielectric or insulator disposed between the capacitive plates.

For some thermal sensors barium strontium titanate (BST) may be used to form the thermal sensitive element for the resulting thermal sensors. Various dopants may be added to the BST depending upon the desired operating characteristics for the resulting thermal sensors. The starting place for fabricating such thermal sensitive elements is typically a wafer of barium strontium titanate or other suitable pyroelectric material having a diameter of approximately one hundred (100) millimeters and an approximate thickness of three (3) millimeters. Various grinding and/or polishing processes are frequently used to reduce the thickness of the BST wafer to approximately twenty-five (25) microns or less for the finished, bonded device.

SUMMARY OF THE INVENTION

In accordance with the present invention, the disadvantages and problems associated with forming previous ceramic wafers used in fabricating hybrid thermal detector systems have been substantially reduced or eliminated. The present invention allows production of a dense ceramic wafer from various pyroelectric and/or bolometric materials for further fabrication of thermal sensitive elements used in hybrid thermal detector systems.

One aspect of the present invention may include a method for fabricating a dense ceramic wafer using cold isostatic pressing techniques along with one or more rigid substrates to create the desired flat surface on the resulting ceramic wafer. The associated flat surface is useful in subsequent processing of the wafer. One of the technical advantages resulting from forming ceramic wafers in accordance with one aspect of the present invention includes the ability to densify the resulting ceramic wafer to produce the desired pyroelectric characteristics and/or bolometric characteristics required by the thermal sensitive elements formed from the ceramic wafer.

Important technical advantages of one embodiment may include substantially reducing the cost and waste associated with forming a dense, ceramic wafer from pyroelectric and/or bolometric material. The resulting ceramic wafer may be used to provide a large number of thermal sensitive elements. Such thermal sensitive elements may be used for fabricating thermal sensors for a focal plane array which may be coupled with an integrated circuit substrate to form a hybrid thermal detector system.

Another aspect of the present invention may include the use of cold isostatic pressing techniques (sometimes referred to as hydrostatic pressing) to form a ceramic wafer of pyroelectric material such as barium strontium titanate (BST). For one embodiment the resulting wafer may be compatible with silicon processing techniques associated with fabricating very large scale integrated circuits. Also, a flexible container or membrane may be used during isostatic pressing to reduce problems related to unevenness in the ceramic powders.

An additional technical advantage of another embodiment may include placing selected powder material used to form the ceramic wafer in a vacuum bag to remove any air trapped in the powder prior to hydrostatically pressing. By removing such air from the powder, pressing flaws in the resulting ceramic wafer are substantially reduced.

Further technical advantages of one embodiment may include using cold isostatic pressing techniques to avoid problems associated with excessive shear forces when a wafer is ejected from a conventional rigid ram and die set. Also, the use of isostatic pressing techniques eliminates the cost associated with ram and die sets capable of handling the large forces associated with pressing ceramic wafers having a diameter of one hundred to one hundred twenty-five (100–125) millimeters. For some applications, the present invention may be used to form ceramic wafers with a diameter of one hundred fifty (150) millimeters and larger. The relatively large surface area of such wafers would require a large, heavy duty ram and die set to withstand the associated loads.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1–7 of the drawings, like numerals being used for like and corresponding parts of the various drawings.

Some infrared detectors and thermal detector systems are based upon either the generation of a change in voltage due to a change in temperature resulting from incident infrared radiation striking a thermal sensor or the generation of a change in voltage due to a photon-electron interaction within the material used to form the thermal sensor. This latter effect is sometimes called the internal photoelectric effect. Other infrared detectors and thermal detector systems are based upon the change in resistance of a thin conductor caused by the heating effect of incident infrared radiation. Such infrared detectors are sometimes referred to as bolometers.

Figure 7:
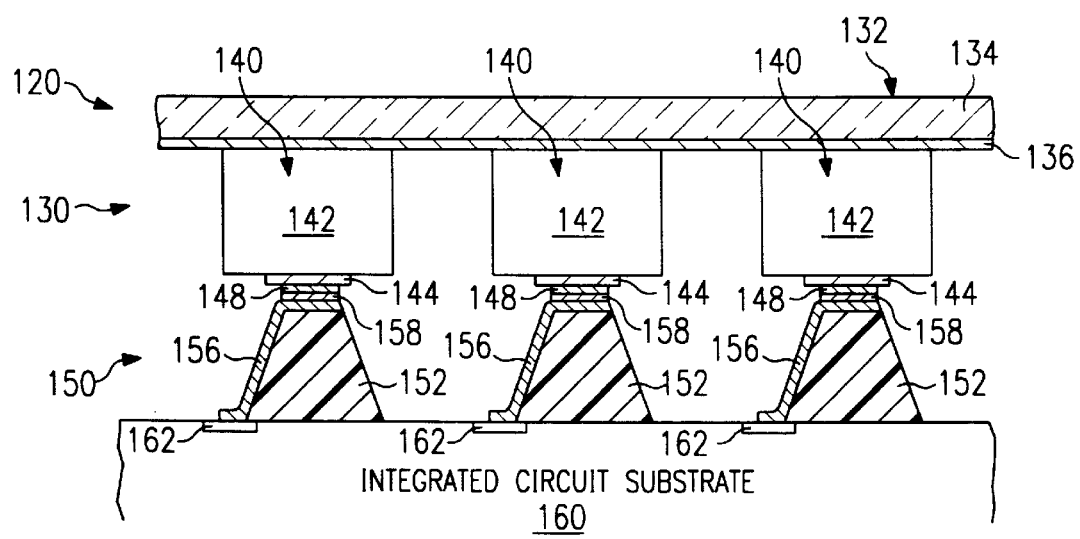
FIG. 7 is a schematic representation in section with portions broken away showing a thermal detector having thermal sensitive elements which may be fabricated from the ceramic wafer of FIG. 6.

Thermal detector systems constructed in part from ceramic wafers formed in accordance with the teachings of the present invention typically function based upon the generation of a change in voltage and/or current due to a change in temperature of the material used to form the ceramic wafer resulting from incident infrared radiation. Thermal detector system 120 shown in FIG. 7 shows one application for such ceramic wafers. However, ceramic wafers formed in accordance with teachings of the present invention may be used to fabricate other types of thermal detectors including bolometers. U.S. Pat. No. 4,143,269 entitled "Ferroelectric Imaging System," issued to McCormack, et al. and assigned to Texas Instruments Incorporated, provides information concerning infrared detectors fabricated from pyroelectric materials.

One of the problems associated with fabricating previous thermal detectors included the high cost associated with forming a very large number of small individual thermal sensitive elements from pyroelectric materials such as barium strontium titanate or bolometric materials such as vanadium oxide. Often such thermal sensitive elements were formed as individual small squares with dimensions corresponding approximately with the individual thermal sensors used to form the resulting focal plane array. By forming a four inch wafer from the desired pyroelectric and/or bolometric materials using the teachings of the present invention, processing techniques and equipment compatible with fabrication of very large integrated circuits from silicon wafers may be used to fabricate the resulting thermal detectors. The use of silicon compatible fabrication processes and equipment results in improved reliability and quality along with reduced cost for the resulting thermal detectors.

In one embodiment, the present invention solves problems associated with forming dense ceramic wafers from pyroelectric and/or bolometric material by using isostatic pressing techniques. In accordance with Pascal's Law, when pressure on a fluid in a closed container is increased or decreased, a pressure change will take place throughout the fluid. Thus, when powdered material is loaded into a flexible, fluid tight container and placed within a closed, fluid filled vessel, any pressure applied to the fluid will be distributed uniformly over the surface of the powdered material in the flexible, airtight container. Powdered material compressed in this fashion will be uniformly compacted in all directions and will retain the general shape of the flexible container in which the powdered material has been loaded. Currently available commercial applications include the use of 2,000 to 60,000 pounds per square inch (psi) pressure to form various types of ceramic components.

Isostatic pressing is typically divided into three different categories defined as cold, hot and explosive pressing. For one application of the present invention, room temperature or cold isostatic pressing may be satisfactorily used to produce the desired dense ceramic wafer. For this application, the pressing is accomplished without applying heat during the related process. A suitable liquid is preferably used as the fluid to carry the pressure in the closed vessel. Thus, this process may also sometimes be referred to as hydrostatic pressing.

Depending upon the type of powdered material, and the desired pyroelectric and/or bolometric characteristics, liquid pressures from 2,000 psi to 60,000 psi may be satisfactorily used to form dense ceramic wafers in accordance with one aspect of the present invention. Varying the hydrostatic pressure will vary both the density and size of the resulting ceramic wafer. Thus, the present invention allows selecting the appropriate pressure and type of powder material to produce a ceramic wafer having the desired characteristics for the resulting thermal sensors.

Figure 1:
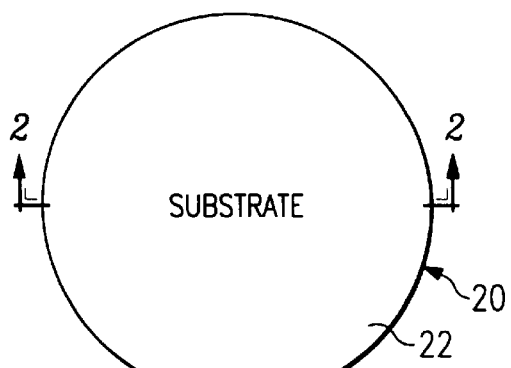
FIG. 1 is a plan view of a substrate which may be used to form a ceramic wafer in accordance with one embodiment of the present invention.
Figure 2:
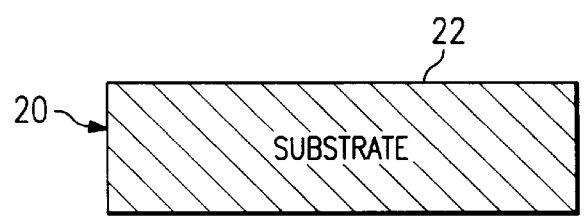
FIG. 2 is a drawing in section taking along lines 2—2 of FIG. 1.

One embodiment of the present invention includes the use of rigid substrate 20 shown in FIGS. 1 and 2. For some applications, substrate 20 may initially have a diameter of approximately five inches along with other dimensions to accommodate shrinkage during densification and still provide a wafer compatible with silicon processing techniques and equipment. Substrate 20 may be formed from aluminum or other materials which are compatible with isostatic pressing of the selected ceramic powder. The diameter of substrate 20 may be selected to compensate for shrinkage of the resulting ceramic wafer during firing. For some applications such shrinkage is approximately twenty percent (20%).

Figure 3:
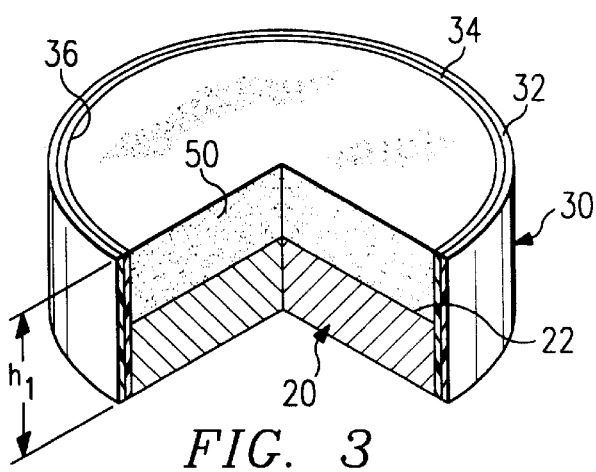
FIG. 3 is an isometric drawing partially in section showing ceramic powder disposed on the substrate of FIG. 1 in a flexible mold having a die cavity prior to hydrostatic pressing in accordance with one aspect of the present invention.
Figure 4:
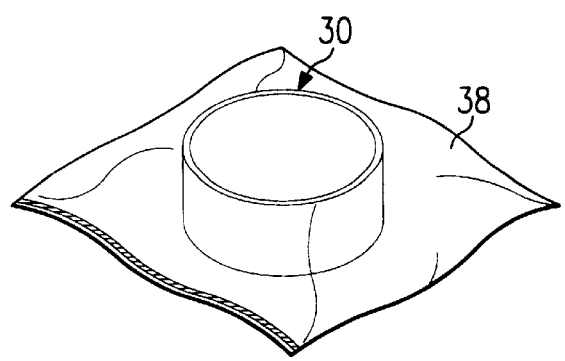
FIG. 4 is an isometric representation of a flexible mold containing ceramic powder and at least one substrate disposed in a vacuum sealed bag.

One embodiment includes the use of flexible mold or die 30 as shown in FIGS. 3 and 4. As will be explained later in more detail, ceramic powder 50 may be placed in flexible mold 30 and subjected to hydrostatic pressing to form dense ceramic wafer 60 shown in FIG. 6. Flexible mold 30 may include one or more flexible layers of polymeric or copolymeric material such as polyvinyl chloride, polyethylene, and urea-formaldehyde. For the example shown in FIG. 3, flexible mold 30 preferably includes a strip of Mylar® polyester film formed in a generally circular configuration with layers 32 and 34. The number of layers and the type of material used to form flexible mold 30 may be selected depending upon the type of ceramic powder 50 and compatibility with the specific hydrostatic pressing techniques. Layers 32 and 34 of flexible mold 30 cooperate to define in part die cavity 36 having a generally hollow, cylindrical configuration to receive first substrate 20 and ceramic powder 50.

As shown in FIG. 3, the inside diameter of die cavity 36 is selected to be compatible with the outside diameter of first substrate 20 which may be disposed within die cavity 36. The remainder of die cavity 36 may then be filled with selected powder material 50 which will be used to form dense ceramic wafer 60. The height ($h_1$) of flexible mold 30 is approximately equal to the thickness of substrate 20 plus the thickness of powder 50 used to form ceramic wafer 60. Flexible mold 30 with first substrate 20 and powder material 50 may then be placed in one or more vacuum sealed bags 38 and subjected to the desired hydrostatic pressing procedure in a pressure vessel (not shown).

For one application ceramic powder 50 may comprise approximately one hundred (100) grams of barium strontium titanate (BST). Other materials in the lead titanate family including lead titanate (PT), lead lanthanum titanate (PLT), lead zirconium titanate (PZT), and lead lanthanum zirconium titanate (PZLT) may be satisfactorily formed into dense ceramic wafers using the present invention.

Various commercially available procedures may be used to prepare the materials comprising ceramic powder 50. Commonly used methods include ball mill grinding and spray drying. Some of the materials used to form ceramic powder 50 such as barium strontium titanate may have a tendency to leach during the fabrication process. By using ball mill grinding and spray drying techniques, all liquids associated with forming ceramic powder 50 may be conserved to maintain the desired composition of material for the resulting ceramic wafer 60.

During the spray drying process various agents may be mixed with the selected ceramic powder. Such agents include binders, dispersing agent, pH control agent, plasticizers, lubricating agents, wetting agents and liquid (typically water). Medium molecular weight polyethylene glycol is one example of a binder satisfactory for use with barium strontium titanate ceramic powders. The type of binder and the amount of binder included within ceramic powder 50 depends upon the desired pressing characteristics of ceramic powder 50, the burnout characteristic of the binder during the firing cycle of ceramic wafer 60, and the desired compact strength for ceramic wafer 60 in the green state prior to completion of the hydrostatic pressing and firing process.

Ceramic powder 50 may also be prepared by a batch reaction of the selected chemicals with the correct composition. Various grinding and milling operations may be formed to process ceramic powder 50 prior to placement in die cavity 36.

Flexible mold 30 with substrate 20 and ceramic powder 50 disposed within die cavity 36 may then be placed in flexible bag 38, which is preferably vacuum sealed. For some applications, flexible mold 30 may be vacuum sealed in two or three flexible bags 38. Vacuum sealing along with the use of multiple flexible bags 38 minimizes the possibility of contaminating ceramic powder 50 during the hydrostatic pressing process and minimizes gas pressure related flaws in the resulting ceramic wafer 60. Flexible bag 38 and flexible mold 30 cooperate with substrate 20 to provide a flexible container for hydrostatic pressing of ceramic powder 50.

Bag 38 with flexible mold 30 disposed therein may then be placed in a suitable hydrostatic pressing chamber (not shown). The hydrostatic chamber is preferably filled with a liquid such as water and the desired pressure applied to form ceramic powders 50 into ceramic wafer 60. Depending upon the type of material used to form ceramic powder 50, the hydrostatic pressure may be varied from 2,000 to 60,000 psi. For some materials such as barium strontium titanate, a hydrostatic pressure of 15,000 psi may provide optimum density for ceramic wafer 60 prior to firing to enable the resulting ceramic wafer 60 after firing to provide the desired operating characteristics for the resulting thermal sensor. For many applications, the hydrostatic pressing may be satisfactorily conducted at room temperature, approximately 20° C. For other applications, the hydrostatic pressing may be conducted at elevated temperatures (30° C. to 100° C. ) to allow for the desired arrangement of particles and grain size in the resulting ceramic wafer 60. The specific temperature during hydrostatic pressing depends on the type of materials used to form ceramic powder 50 and the type of binder included within ceramic powder 50.

An important feature of the present invention includes the use of flexible mold 30 which deforms to compensate for any shrinkage in ceramic powder 50 while at the same time maintaining the desired circular configuration and hydrostatic pressure on ceramic powder 50. Hydrostatic pressing also avoids pressure or stress release problems associated with forming a ceramic wafer using a rigid ram and die mold.

Following hydrostatic pressing, bag 38 and flexible mold 30 may be removed from the hydrostatic chamber. The "green wafer" formed from ceramic powders 50 may next be removed from flexible mold 30. Various sintering processes may be used to remove the binder from the green wafer. Sintering may also be used to establish the desired densification and grain growth for finished ceramic wafer 60.

For some materials such as barium strontium titanate, the green wafer may shrink radially as much as 20% during the densification process. Therefore, the dimensions of flexible mold 30 and the amount of ceramic powder 50 should be selected based on the anticipated radial shrinkage during the densification process. By selecting the proper dimensions for flexible mold 30 and the amount of ceramic powder 50 disposed therein, the present invention allows minimizing the amount of material which must be removed to provide the desired dense, flat ceramic wafer 60. One of the benefits of the present invention includes the ability to control or adjust the characteristics of resulting ceramic wafer 60, both by presintering reactions prior to placing ceramic powder 50 into flexible mold 30 and during the sintering process following hydrostatic pressing.

Figure 5:
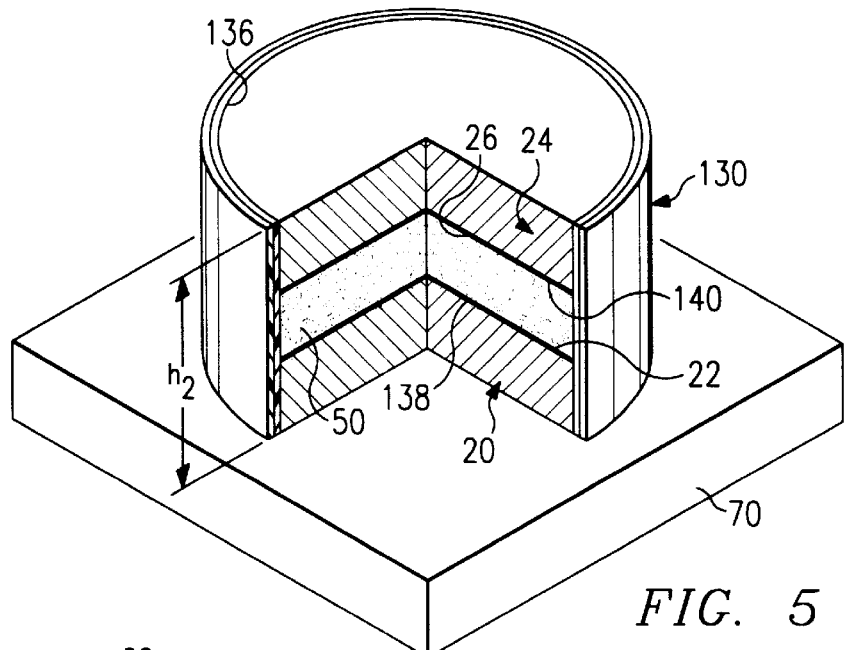
FIG. 5 is an isometric drawing partially in section showing another embodiment of the present invention for forming ceramic wafers using hydrostatic pressing techniques.
Figure 6:
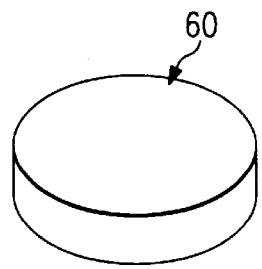
FIG. 6 is an isometric representation of a ceramic wafer formed in accordance with the teachings of the present invention.

Another embodiment may include flexible mold or die 130 shown in FIG. 5. Flexible mold 130 may be formed from one or more layers of Mylar® polyester film as previously described for flexible mold 30. The height ($h_2$) of flexible mold 130 is preferably greater than the height ($h_1$) of flexible mold 30. This increase in height in flexible mold 130 allows placing a second substrate 24 within die cavity 136.

As shown in FIG. 5, the inside diameter of die cavity 136 is selected to be compatible with the outside diameter of first substrate 20 and second substrate 24. First substrate 20 is preferably disposed within die cavity 136. A layer of barrier material 138 may be placed on first substrate 20. Barrier layer 138 may be formed from paper or other suitable material compatible with ceramic powder 50. The desired amount of ceramic powder 50 is then placed on barrier layer 138 within die cavity 136. A second barrier layer 140 may be placed on top of ceramic powder 50 within die cavity 136. Finally, second substrate 24 may be inserted into die cavity 136 on top of second barrier layer 140. If desired, barrier layer 138 may also be used with substrate 20 shown in FIG. 3.

For some applications, flexible mold 130 with first substrate 20, ceramic powder 50 and second substrate 24 disposed therein may be placed on vibrating table 70. Vibration of flexible mold 30 minimizes any void spaces which may be present within ceramic powder 50 and evenly distributes ceramic powder 50 resulting in a more uniform, dense ceramic wafer 60. Flexible mold 130, with ceramic powder 50 disposed therein may then be processed as previously described for flexible mold 30.

By placing ceramic powder 50 between first substrate 20 and second substrate 24, the surface finish and density or compactness of resulting ceramic wafer 60 may be enhanced. For one application, separation layers 38 and 40 are preferably formed from lint-free paper. Separation layers 138 and 140 perform several functions including compensating for volumetric changes in ceramic powder 50 during the hydrostatic pressing and minimizing contamination between ceramic powder 50 and the respective aluminum substrates 20 and 24. Also, the use of lint-free paper to form separation layers 38 and 40 reduces friction forces between ceramic powder 50 and the adjacent aluminum substrates 20 and 24. By reducing such friction forces, cracking of the resulting ceramic wafer may be substantially minimized or eliminated. For other applications, the use of separation layers 138 and/or 140 may be eliminated by forming first substrate 20 and second substrate 24 from material compatible with the specific type of ceramic powder 50. Examples of such materials include stainless steel, silicon or glass. Finally, a thin glass insert or a deposited layer of silicon or glass may be placed on aluminum substrate 20 as appropriate.

The present invention results in producing a dense, flat ceramic wafer 60 which may further be processed for use in conventional silicon processing techniques to produce thermal detector system 120 shown in FIG. 7. Such further processing of ceramic wafer 60 may include firing as appropriate. Thermal detector system 120 may be described as a hybrid solid state thermal detector formed by mounting focal plane array 130 with thermal isolation structure 150 on integrated circuit substrate 160. Focal plane array 130 preferably includes a plurality of thermal sensors 140. Focal plane array 130 may be both electrically and mechanically coupled with integrated circuit substrate 160 by thermal isolation structure 150 to produce a thermal image in response to incident infrared radiation.

The components of focal plane array 130 include infrared absorber and common electrode assembly 132 and a plurality of thermal sensors 140. Infrared absorber and common electrode assembly 132 may further comprise one or more layers of optical coating 134 from a suitable dielectric material and common electrode 136 which cooperate to form a tuned cavity.

Each thermal sensor 140 preferably includes thermal sensitive element 142 which has been formed from ceramic wafer 60. One side of each thermal sensitive element 142 is preferably attached to common electrode 136. Sensor signal electrodes 144 are attached to the opposite side of respective thermal sensitive elements 142. For some applications, ceramic wafer 60 may be formed from barium strontium titanate (BST) or other pyroelectric material to provide the desired operating characteristic for the resulting thermal sensitive elements 142.

Thermal isolation structure 150 may include a plurality of mesa type structures 152 disposed in integrated circuit substrate 160 adjacent to respective contact pads 162. Thermal isolation structure 150 may be used to provide mechanical support during bonding of focal plane array 130 with integrated circuit substrate 160. Thermal isolation structure 150 may also provide an electrical interface between each thermal sensor 140 in focal plane array 130 and integrated circuit substrate 160. Mesa strip conductors 156 provide a signal path between the top of each mesa type structure 152 and the adjacent contact pad 162.

Various types of semiconductor materials and integrated circuit substrates may be satisfactorily used with ceramic wafer 60. U.S. Pat. No. 4,143,269 entitled Ferroelectric Imaging System provides information concerning infrared detectors fabricated from pyroelectric materials and a silicon switching matrix or integrated circuit substrate. Examples of previous thermal isolation structures are shown in U.S. Pat. No. 5,047,644 entitled Polyimide Thermal Isolation Mesa for a Thermal Imaging System. Ceramic wafer 60 may be used with the fabrication techniques and materials shown in both patents during fabrication of thermal detector system 120.

Although the present invention has been described with several embodiments, various and changes and modifications may be suggested to one skilled in the art, and it is intended that the present invention encompass such changes and modifications as fall within the scope of the appended claims.

What is claimed is:

1. A method of forming a flat ceramic wafer for use in fabricating a thermal detector, comprising the steps of:

providing a flexible mold having a die cavity disposed therein;

placing a rigid first substrate in the die cavity, the first substrate having a configuration corresponding with the interior of the die cavity and a flat face;

placing a ceramic powder on the first substrate's flat face within the die cavity;

placing the flexible mold along with the ceramic powder and first substrate in a flexible container and vacuum sealing the flexible container to remove air from the ceramic powder and the die cavity; and hydrostatically pressing the ceramic powder and first substrate within the die cavity to form the flat ceramic wafer.

2. The method of claim 1 further comprising the step of placing a second rigid substrate having a flat face in the die cavity with the ceramic powder disposed between the first substrate's flat face and the second substrate's flat face; wherein the second rigid substrate is supported only by the ceramic powder.

3. The method of claim 1, wherein the ceramic powder comprises barium strontium titanate and the hydrostatic pressing uses a liquid pressure of approximately fifteen thousand pounds per square inch.

4. The method of claim 1, wherein the ceramic powder is selected from the group consisting of lead titanate, lead lanthanum titanate, lead zirconium titanate and lead lanthanum zirconium titanate.

5. The method of claim 1, wherein the ceramic powder comprises bolometric material.

6. The method of claim 1, wherein the flexible container further comprises two vacuum sealed bags.

7. A method for forming a flat, dense ceramic wafer from pyroelectric material for use in fabricating a hybrid thermal detector comprising the steps of:

providing a flexible mold having a die cavity disposed therein;

placing a first rigid substrate in the die cavity, the first substrate having configuration corresponding with the interior of the die cavity and a flat face;

placing a ceramic powder formed from the pyroelectric material on the first substrate within the die cavity;

placing a second rigid substrate having a flat face in the die cavity with the ceramic powder disposed between the first substrate's flat face and the second substrate's flat face;

placing a first barrier layer between the first substrate and the ceramic powder;

placing a second barrier layer between the second substrate and the ceramic powder; wherein the second barrier layer and the second rigid substrate are supported only by the ceramic powder;

placing the mold along with the ceramic powder, the first substrate and the second substrate in a flexible vacuum sealed bag to remove air from the ceramic powder disposed in the die cavity; and hydrostatically pressing the ceramic powder the first substrate and the second substrate within the die cavity to form the ceramic wafer.

8. The method of claim 7 further comprising the steps of:

preparing the ceramic powder by ball mill grinding and spray drying; and during the spray drying step mixing the ceramic powder with selected agents.

9. The method of claim 7, wherein the step of hydrostatic pressing is performed at a temperature less than 100° C.

10. The method of claim 7, wherein the pyroelectric material is selected from the group consisting of barium strontium titanate, lead titanate, lead lanthanum titanate, lead zirconium titanate, lead barium strontium titanate and lead lanthanum zirconium titanate.

11. The method of claim 7, wherein the first and second substrates have a combined thickness less than the height of the die cavity and the ceramic powder has a thickness approximately equal to the height of the die cavity less the combined thickness.

12. The method of claim 7, further comprising the step of vibrating the flexible mold with the first substrate, second substrate and ceramic powder disposed in the die cavity prior to placing the flexible mold in the flexible vacuum sealed bag.

13. The method of claim 7 further comprising the step of mixing a binder of medium molecular weight polyethylene glycol with the ceramic powder prior to placing the ceramic powder on the first substrate.

* * * * *